United States Patent
Ito

(10) Patent No.: US 7,482,541 B2
(45) Date of Patent: Jan. 27, 2009

(54) PANEL FOR ELECTRO-OPTICAL APPARATUS, METHOD OF MANUFACTURE THEREOF, ELECTRO-OPTICAL APPARATUS AND ELECTRONIC APPARATUS

(75) Inventor: Haruki Ito, Suwa (JP)

(73) Assignee: Seiko Epson Corporation (JP)

( * ) Notice: Subject to any disclaimer, the term of this patent is extended or adjusted under 35 U.S.C. 154(b) by 372 days.

(21) Appl. No.: 11/073,481

(22) Filed: Mar. 4, 2005

(65) Prior Publication Data

US 2005/0205296 A1    Sep. 22, 2005

(30) Foreign Application Priority Data

Mar. 17, 2004    (JP)    ............... 2004-076323

(51) Int. Cl.
H05K 3/36    (2006.01)
H05K 1/11    (2006.01)
H01R 12/04    (2006.01)

(52) U.S. Cl. ........................ 174/261; 29/830

(58) Field of Classification Search ............... 174/261, 174/260; 361/777–779, 770; 29/830
See application file for complete search history.

(56) References Cited

U.S. PATENT DOCUMENTS

| | | | |
|---|---|---|---|
| 4,813,129 A * | 3/1989 | Karnezos ................... 29/832 |
| 5,345,365 A * | 9/1994 | Herndon et al. ............. 361/760 |
| 5,393,697 A | 2/1995 | Chang et al. |
| 5,657,207 A * | 8/1997 | Schreiber et al. ........... 361/774 |
| 6,396,145 B1 * | 5/2002 | Nagai et al. ................. 257/737 |
| 6,734,029 B2 | 5/2004 | Furusawa |

FOREIGN PATENT DOCUMENTS

| | | |
|---|---|---|
| EP | 0827190 | 3/1998 |
| JP | 64-013734 | 1/1989 |
| JP | 64-077025 | 3/1989 |
| JP | 01-281433 | 11/1989 |
| JP | 3-231437 | * 10/1991 |
| JP | 05-243231 | 9/1993 |
| JP | 05243231 | 9/1993 |
| JP | 06-097608 | 4/1994 |
| JP | 06-180460 | 6/1994 |
| JP | 06180460 | 6/1994 |
| JP | 08-008001 | 1/1996 |
| JP | 2002-164635 | 6/2002 |
| JP | 2004/006314 | 1/2004 |
| JP | 2004-077386 | 3/2004 |
| JP | 2006-509252 | 3/2006 |
| WO | 2004/053585 | 6/2004 |

OTHER PUBLICATIONS

Examination result issued in corresponding European patent application.
Communication from Japanese Patent Office re: related application.

* cited by examiner

*Primary Examiner*—Jeremy C Norris
(74) *Attorney, Agent, or Firm*—Harness, Dickey & Pierce, P.L.C.

(57) ABSTRACT

A panel for an electro-optical apparatus, includes a substrate, a plurality of wires formed on the substrate, convex portions formed from resin and provided either on the plurality of wires or on the substrate, conductive layers provided so as to cover at least a portion of the surfaces of the convex portions, and that are electrically connected to the respective wires, and a plurality of external connection terminals for electrically connecting electronic components, formed by the convex portions and the conductive layers.

26 Claims, 15 Drawing Sheets

PANEL FOR ELECTRO-OPTICAL APPARATUS, METHOD OF MANUFACTURE THEREOF, ELECTRO-OPTICAL APPARATUS AND ELECTRONIC APPARATUS

BACKGROUND OF THE INVENTION

1. Field of the Invention

The present invention relates to a panel for an electro-optical apparatus, a method of manufacture thereof, an electro-optical apparatus and an electronic apparatus.

Priority is claimed on Japanese Patent Application No. 2004-76323, filed Mar. 17, 2004, the contents of which are incorporated herein by reference.

2. Description of Related Art

Conventionally, when packaging a semiconductor device such as a drive IC on a liquid crystal panel or the like, a method is widely used in which what are known as Au bumps are formed on the drive IC, and the drive IC is then packaged on the liquid crystal panel or the like via an adhesive agent. These Au bumps are formed by sputtering a seed layer of TiW/Au or the like on the drive IC, and then patterning the resist. Subsequently, electrolytic gold plating is coated on the resist to a height of approximately 20 µm. An anisotropic conductive film (ACF) is widely used for the adhesive agent that bonds a drive IC to a liquid crystal display panel. By using an adhesive agent such as ACF or the like, the Au bumps formed on the drive IC are electrically connected to the electrodes of the liquid crystal display panel (see, for example, Japanese Unexamined Patent Application, First Publication No. S64-77025).

However, the Au bumps that are formed on the drive IC are expensive due to the fact that Au (i.e., gold) is used therefor. Moreover, as the pitch between electrodes of the drive IC has grown narrower, it is predicted that consistent bump formation such as the formation of high aspect resist or the etching of the seed layer and the like will become more difficult.

Furthermore, because an ACF or the like is used when the drive IC is bonded to the liquid crystal display panel, there is a possibility that short-circuiting will occur between bumps and the liquid crystal display panel will not function normally.

Moreover, in recent years, due to the increasing demands for high definition display devices such as liquid crystal display panels and the like, high-density packaging is demanded for drive IC's that are mounted thereon. One technology for making high-density packaging possible that has attracted notice in recent years is what is known as wafer level CSP where manufacturing is performed at the wafer level. In this wafer level CSP, a plurality of semiconductor elements whose wiring has a resin layer are formed in wafer units, and semiconductor devices are then formed by cutting each semiconductor element.

However, in order to achieve high-density packaging, the aforementioned narrowing in the pitch between electrodes is strongly desired even in this type of wafer level CSP technology.

As a result of this, the development, for example, of low-cost non-electrolytic Ni bumps is advancing as a technology to deal with the demands for narrower pitches.

In addition, a method of avoiding short-circuits between bumps, which is a common problem with narrower pitches, has been proposed in which a glass substrate on at least the outer circumference of an electrode terminal portion of a liquid crystal panel that faces an electrode pad of the drive IC that is packaged on the liquid crystal panel is half-etched, so that protruding electrodes are formed on the liquid crystal panel side. According to this method, it is possible to avoid short-circuiting in the wiring pattern of the liquid crystal display panel electrodes by using an adhesive agent such as an ACF or the like (see, for example, Japanese Unexamined Patent Application, First Publication No. H1-281433).

However, in the aforementioned method that uses non-electrolytic Ni for the bumps, because non-electrolytic Ni bumps are harder than Au bumps, when performing chip on glass (COG) packaging of a drive IC directly onto a display body panel, in particular, the packaging is sometimes difficult from the viewpoint of connection reliability.

Moreover, in the method in which half-etching is performed on the substrate on the liquid crystal panel side, the protruding electrodes that are provided on the liquid crystal panel side are formed from glass. Therefore, in these protruding electrodes that are made of glass, when the drive IC is being packaged on the liquid crystal panel, in some cases, a thermal deformation such as stress or the like occurs on the liquid crystal panel or on the drive IC, and it is difficult for this deformation to be absorbed. As a result, malfunctions may occur when packaging electronic components.

The present invention was conceived in view of the above described circumstances, and it is an object thereof to provide a panel for an electro-optical apparatus that enables the pitch between electrodes to be narrowed, and that also enables electrodes having a high degree of connection reliability to be manufactured, and to provide a method of manufacturing the panel for an electro-optical apparatus, and also to provide an electro-optical apparatus and a method of manufacturing the electro-optical apparatus, and to provide an electronic apparatus.

SUMMARY OF THE INVENTION

In order to solve the above described problems, the present invention is a panel for an electro-optical apparatus, has a substrate, a plurality of wires formed on the substrate, convex portions formed from resin and provided either on the plurality of wires or on the substrate, conductive layers provided so as to cover at least a portion of the surfaces of the convex portions, and that are electrically connected to the respective wires, and a plurality of external connection terminals for electrically connecting electronic components, formed by the convex portions and the conductive layers.

According to this type of structure, because convex portions that are made of resin are provided on a substrate, it is not necessary to form electrolytic Au bumps, which are high-cost, conductive protruding portions, on connection terminals of an electronic component that is being packaged on the substrate. In addition, when packaging the electronic component on the substrate, there are cases in which heat deformation such as stress is generated in the substrate or electronic component by heating or pressure. However, according to this type of structure, because convex portions that are made of resin are provided on the substrate, when the electronic component is being packaged on the substrate, it is possible to absorb stress from the electronic component or panel. As a result, malfunctions in the packaging of the electronic component can be avoided.

Furthermore, the present invention is a panel for an electro-optical apparatus, has a substrate, convex portions formed from resin and provided on the substrate, a plurality of wires provided on the substrate so as to cover at least a portion of the surfaces of the convex portions, and a plurality of external connection terminals for electrically connecting electronic components, formed by the convex portions and the wires.

According to this type of structure, in the same way as in the above described invention, not only is it not necessary to form high-cost electrolytic Au bumps, but also, when an electronic component is being packaged on a substrate, it is possible to absorb stress from the electronic component or panel. Moreover, according to this, it is also unnecessary to provide a conductive layer that covers the surfaces of the convex portions, and to electrically connect this conductive layer to each wire. Namely, the conductive layer is formed integrally with the wire, and the wire is able to also perform the functions of the conductive layer. It is, therefore, not necessary to form a conductive layer that can be connected to the wires, and problems such as broken wires can be avoided.

It is also possible for the convex portions to be formed separated from each other with one convex portion formed for each external connection terminal.

When packaging the electronic component on the substrate, there are cases in which heat deformation such as stress is generated in the substrate or electronic component by heating or pressure. However, according to this type of structure, because a convex portion is provided independently for each of the external connection terminals, compared with when the convex portions are formed continuously, there is a greater degree of freedom regarding the convex portions, and each convex portion is able to absorb stress from the electronic component or panel. As a result, it is possible to avoid malfunctions when packaging the electronic component, and an improvement in the connection reliability can be achieved.

Alternatively, it is also possible for the convex portions to be formed a continuous convex portion extending over a plurality of mutually adjacent external connection terminals.

According to this type of structure, because it is unnecessary to form the convex portions separate from each other with one convex portion being provided for each external connection terminal, so that only one continuous convex portion needs to be formed, the convex portion can be formed without any narrowing in pitch needing to be considered.

Alternatively, at least in a portion of the continuous convex portion, a height of the continuous convex portion is lower at a portion located between adjacent external connection terminals than at the external connection terminals.

According to this type of structure, not only does it become possible to deal with the aforementioned narrowing in pitch, but it is also possible to absorb stress in an electronic component or panel when the electronic component is being packaged on the substrate. In addition, when an electronic component is being packaged on a substrate using an adhesive agent that contains fine, conductive particles, because portions that are located between external connection terminals are formed at a lower height than the external connection terminals, it is possible to prevent short-circuiting between external connection terminals. As a result, it is possible to achieve an improvement in connection reliability when an electronic component is being packaged on a substrate.

The present invention is a method of manufacturing a panel for an electro-optical apparatus, has the steps of forming a plurality of wires on a substrate, forming convex portions composed of resin, either on the plurality of wires or on the substrate, forming conductive layers that are electrically connected to the respective wires so as to cover at least a portion of the surfaces of the convex portions, and forming a plurality of external connection terminals for electrically connecting electronic components by the convex portions and the conductive layers.

According to this type of structure, because a step is provided in which convex portions that are made of resin are formed on a substrate, it is not necessary to have a step in which electrolytic Au bumps, which are high-cost, conductive protruding portions, are formed on connection terminals of an electronic component that is being packaged on the substrate. In addition, when packaging the electronic component on the substrate, there are cases in which heat deformation such as stress is generated in the substrate or electronic component by heating or pressure. However, according to this type of structure, because a step is provided in which convex portions that are made of resin are formed on the substrate, when the electronic component is being packaged on the substrate, it is possible to absorb stress from the electronic component or panel. As a result, malfunctions in the packaging of the electronic component can be avoided.

The present invention is a method of manufacturing a panel for an electro-optical apparatus, has the steps of forming convex portions that are composed of resin on a substrate, forming a plurality of wires on the substrate so as to cover at least a portion of the surfaces of the convex portions, and forming a plurality of external connection terminals for electrically connecting electronic components by the convex portions and the wires.

According to this type of structure, because the wires also perform the functions of a conductive layer, the wires and conductive layer can be formed in a single step. As a result, a reduction in the number of manufacturing steps can be achieved.

It is also possible that the resin be a photosensitive resin, and that the convex portions be formed by a photolithographic method.

According to this type of structure, the convex portions can be formed accurately and with a high degree of precision in predetermined positions on the substrate. Moreover, by controlling the exposure, developing, or curing conditions, smooth, hemispherical convex portions can be formed.

Alternatively, it is also possible for the convex portions to be formed by a droplet discharge method.

According to this type of structure, droplets of liquid material can be accurately discharged onto predetermined positions, and convex portions can be formed using the minimum amount of droplets of liquid material that is necessary.

Alternatively, it is also possible for the conductive layers or the wires to be formed by a droplet discharge method.

According to this type of structure, droplets of liquid material can be accurately discharged onto predetermined positions, and a conductive layer or wires can be formed using the minimum amount of droplets of liquid material that is necessary.

The electro-optical apparatus of the present invention is an electro-optical apparatus in which an electronic component is packaged via an adhesive agent on the external connection terminals of the above described panel for an electro-optical apparatus.

According to this type of structure, because convex portions that are made of resin are provided on a substrate, when the electronic component is being packaged on the substrate, it is possible to absorb stress from the electronic component or panel. As a result, malfunctions in the packaging of the electronic component can be avoided, and an improvement in the connection reliability can be achieved. It is, consequently, possible to provide an electro-optical apparatus that has an excellent display quality. Examples of the electro-optical apparatus include organic EL apparatuses, plasma type display apparatuses and the like.

It is also possible for non-electrolytic Ni bumps to be formed on an electrode surface of the electronic component.

According to this type of structure, because the electrodes are formed so as to protrude beyond electrodes normally provided on an electronic component, it is possible to improve the connection reliability between these electrodes and external connection terminals when this electronic component is packaged on a substrate. Moreover, because they are formed so as to cover the top portions of Al electrodes, corrosion of the electrodes can be prevented.

Alternatively, it is also possible for the adhesive agent to not contain conductive particles.

According to this type of structure, because the adhesive agent does not contain conductive particles, a reduction in costs can be achieved compared with when the adhesive agent does contain conductive particles. In addition, short-circuiting malfunctions between external connection terminals can be prevented.

The electronic apparatus of the present invention is provided with the above described electro-optical apparatus.

According to this type of structure, an electronic apparatus can be provided that has an excellent display quality.

BRIEF DESCRIPTION THE DRAWINGS

FIG. 2A is a cross-sectional view taken along a line A-A' of a protruding area shown in FIG. 1, while

FIG. 10A is a schematic structural view of an inkjet head, while

FIG. 13A is a cross-sectional view taken along a line A-A' of a protruding area shown in FIG. 1, while

DETAILED DESCRIPTION OF THE INVENTION

Figure 1:
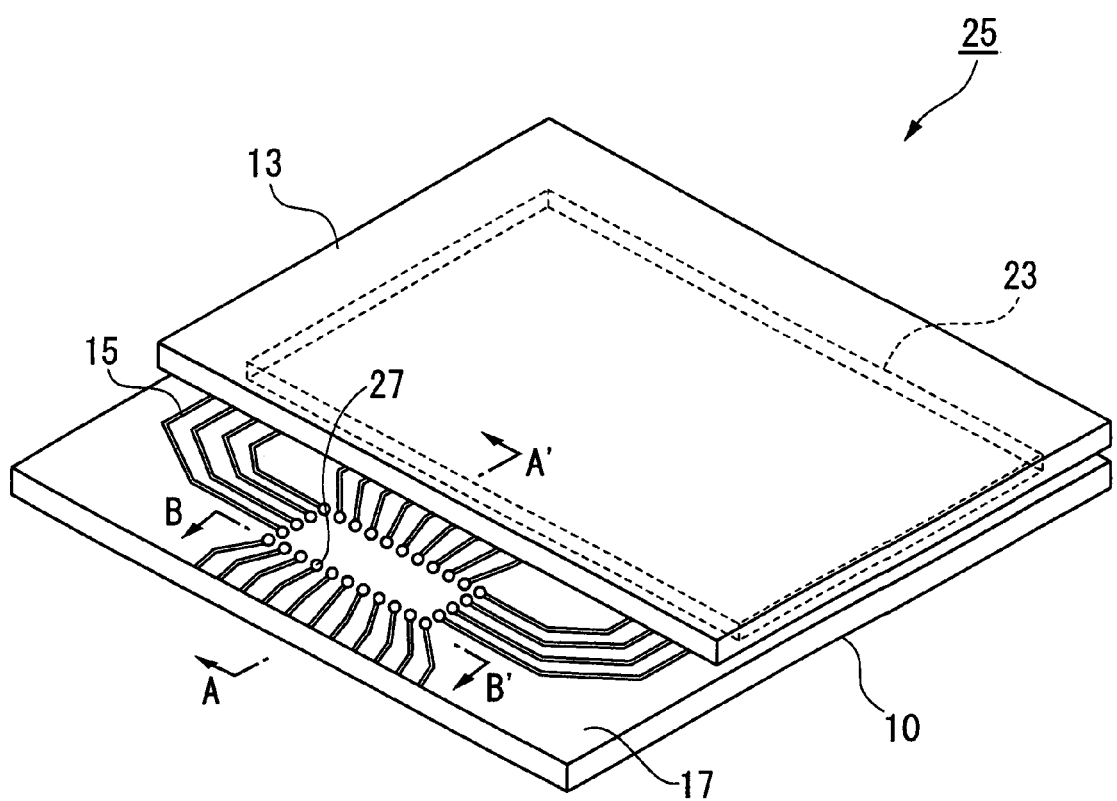
FIG. 1 is a perspective view showing the schematic structure of a liquid crystal panel.

Embodiments of the present invention will now be described in detail with reference made to the drawings. Note that, in these embodiments, a description is given firstly of the structure and manufacturing method of a liquid crystal panel in a state before a liquid crystal drive IC or the like (described below) serving as a semiconductor chip is chip-on-glass (COG) packaged on a liquid crystal panel.

Note also that in each of the drawings used in the description given below, the scale is changed for each layer and each member in order to make each layer and each member large enough to be recognized in the drawings.

FIRST EMBODIMENT (Structure of a Liquid Crystal Panel)

FIG. 1 is a perspective view showing the schematic structure of a liquid crystal panel 25 (i.e., a panel for an electro-optical apparatus) of the present embodiment. In the liquid crystal panel 25, a first substrate 10 (i.e., a substrate) and a second substrate 13 are bonded by an ultraviolet light-cured sealing material 23. Liquid crystal is sealed and held inside an area surrounded by this sealing material 23. In addition, the liquid crystal panel 25 is provided with a plurality of wires 15 that are formed in a predetermined pattern on the first substrate 10, convex portions 19 that are formed on top of the wires 15, and conductive layers 21 that are formed on top of the convex portions 19. Furthermore, illumination devices such as backlights and other accessory equipment are also provided for the liquid crystal panel 25.

The first substrate 10 is formed from soda glass and a transparent electrode layer is formed on top of this substrate. The thickness of the first substrate is, for example, 0.7 mm. In the same way, the second substrate 13 is also formed from soda glass, and a transparent electrode layer is formed on top of this substrate. The thickness of the second substrate is, for example, 0.7 mm.

The substrate that is used for the first substrate 10 has a larger outer configuration than that of the substrate that is used for the second substrate 13. Accordingly, when this pair of substrates are adhered together, edges (i.e., end surfaces of the substrate) of three sides of the two substrates (i.e., the top side, the right side, and the left side in FIG. 1) are substantially aligned, however, a peripheral portion of the first substrate 10 protrudes beyond the remaining side (i.e., the bottom side in FIG. 1) of the second substrate 13. In the present embodiment, the protruding peripheral portion of the first substrate 10 is called a protruding area 17.

A plurality of pixel electrodes are formed on the joining surface side of the first substrate 10 (except for on the protruding area 17). In contrast, striped electrodes in the form of thin strips are formed on the joining surface side of the second substrate 13. Oriented films are further formed on inner surface sides of each of the electrodes that are formed on the first substrate 10 and the second substrate 13. Note that a thin film transistor (TFT) or the like is formed as a switching element on each pixel electrode of the first substrate 10.

Figure 2A:
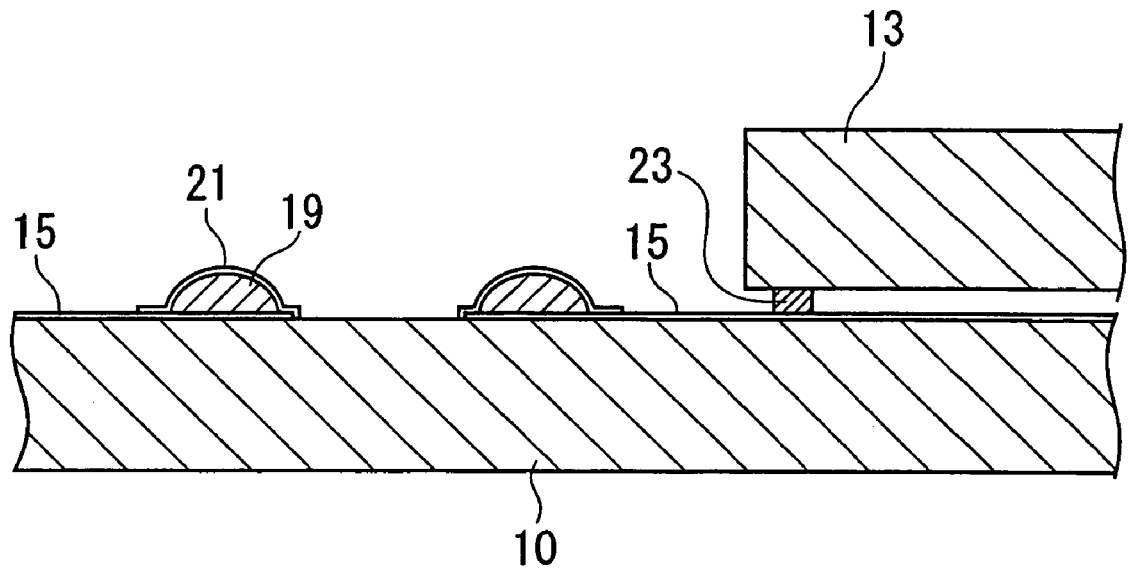
Figure 2B:
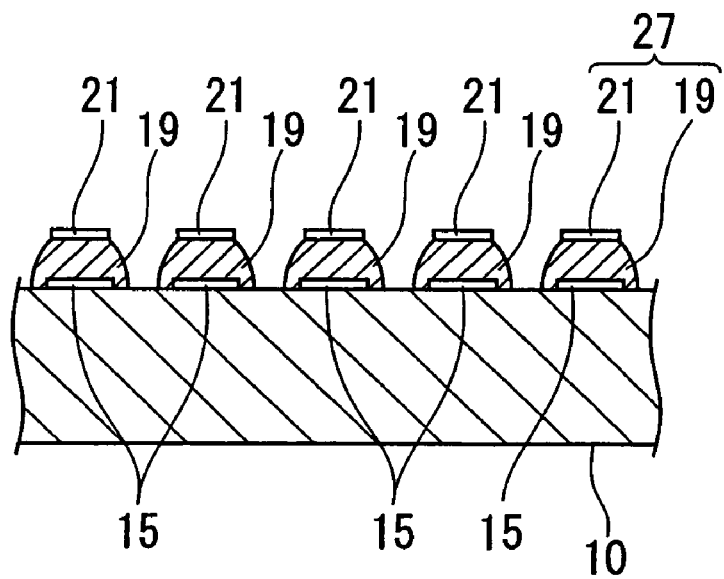
FIG. 2B is a cross-sectional view taken along a line B-B' of a protruding area shown in FIG. 1.

FIG. 2A is a cross-sectional view taken along a line A-A' of the protruding area 17 of the first substrate 10 in the present embodiment. FIG. 2B is a cross-sectional view taken along a line B-B' of the protruding area 17 of the first substrate 10. As described above, a plurality of wires 15 are formed in a predetermined pattern on the protruding area 17. The convex portions 19 are formed on one end of each wire 15. In addition, the conductive layers 21 are formed on each of the convex portions 19.

A plurality of the wires 15 are formed in a predetermined pattern on the first substrate 10. One end of each of the plurality of wires 15 that are formed in a predetermined pattern is formed so as to correspond to a packaging position of an electrode of a liquid crystal drive IC 30 (i.e., an electronic component) that is to be packaged on the first substrate 10. Specifically, a plurality of electrodes of the liquid crystal drive IC 30, which is formed in a rectangular shape, are formed with a uniform space between each along each of two mutually parallel sides that run in the longitudinal direction of the rectangular shape. In addition, a plurality of these electrodes are formed with a uniform space between each along each of two mutually parallel sides that run in the transverse direction of the rectangular shape. Accordingly, as shown in FIG. 1, one end of each of the plurality of wires 15 is formed so as to be located in a position, or near to a position where an electrode of the liquid crystal drive IC 30 is to be packaged.

Indium tin oxide (ITO), or a metal such as Ti, Cr, W, Ta, Mo, and Pb, or an alloy containing at least one of these can be used for the plurality of wires 15 that are formed in the predetermined pattern.

As shown in FIG. 2B, the convex portions 19 are formed respectively on one end of the plurality of wires 15 that are formed in the predetermined pattern. Namely, the convex portions 19 are formed independently on each wire 15. The convex portions 19 are formed in a hemispherical shape, and the diameter of these hemispheres is larger than the width of the wire used for the wires 15. Note that the convex portions 19 are formed respectively on one end of the plurality of wires 15 that are formed in the predetermined pattern, however, it is preferable that the convex portions 19 be formed in the vicinity of the one end of the wires 15.

The convex portions 19 are formed from resin. Specifically, they can be formed from resin such as a polyimide resin, a silicone modified polyimide resin, an epoxy resin, a silicone modified epoxy resin, benzocyclobutane (BCB), polybenzoxazole (PBO), phenol based resins, and acrylic based resins. In order to increase the connection reliability between the convex portions 19 and the liquid crystal drive IC 30 being packaged, it is preferable that the convex portions 19 protrude to a greater height than the wires 15.

The conductive layers 21 are formed so as to cover a portion of the surface of the convex portions 19 that are formed in a hemispherical shape on one end of each of the plurality of wires 15. Furthermore, the conductive layers 21 extend from the surface of the convex portions 19 to the top of the wires 15, and are electrically connected to the wires 15 via the convex portions 19.

A metal such as Au, TiW, Cu, Cr, Ni, Ti, W, NiV, and Al can be used for the conductive layers 21. The conductive layers 21 can also be formed by laminating these metals. Note that it is preferable that the conductive layers 21 (or at least one layer thereof in the case of a laminated structure) be formed using a metal, for example, Au, TiW, Cr that has a higher corrosion resistance than that of the electrodes. By using such a metal, corrosion of electrodes is prevented, and it is possible to prevent electrical malfunctions being generated.

In the present embodiment, the convex portions 19 and the conductive layers 21, which are formed so as to cover a portion of the surface of the convex portions 19 and which are electrically connected to the wires 15 that are formed below the convex portions 19, together constitute an external connection terminal 27. A plurality of external connection terminals 27 that are formed in this manner are formed on the protruding area 17 at positions where electrodes that are formed on the liquid crystal drive IC 30 are to be packaged.

The liquid crystal drive IC 30 is packaged on the external connection terminals 27, so that the external connection terminals 27 and the electrodes that are formed on the liquid crystal drive IC 30 are electrically connected.

By employing a structure such as this, because convex portions 19 that are formed from resin are provided on the first substrate 10, when the liquid crystal drive IC 30 is being packaged on the first substrate 10, it is possible to absorb stress from the liquid crystal drive IC 30 or from the liquid crystal panel 25. As a result, it is possible to avoid malfunctions when packaging the liquid crystal drive IC 30, and it becomes possible to achieve an improvement in connection reliability.

Figure 3A:
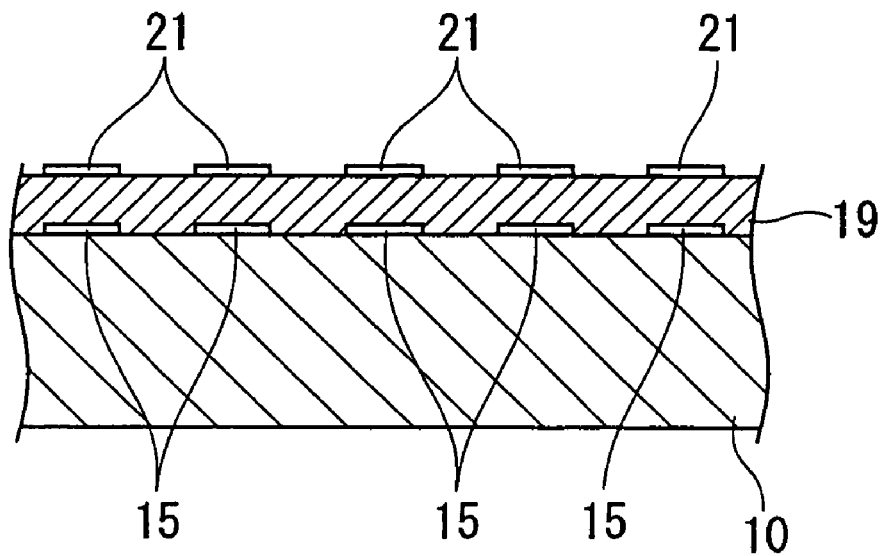
FIGS. 3A and 3B are other cross-sectional views taken along a line B-B' of a protruding area shown in FIG. 1.

Note that, in the above embodiment, the convex portions 19 are formed apart from each other in each external connection terminal 27, however, it is preferable that the convex portions 19 be formed continuously so as to extend for a plurality of mutually adjacent external connection terminals 27. FIG. 3A is a cross-sectional view taken across a line B-B' in FIG. 1 when the convex portions 19 are formed continuously so as to extend for a plurality of mutually adjacent external connection terminals 27.

Figure 3B:
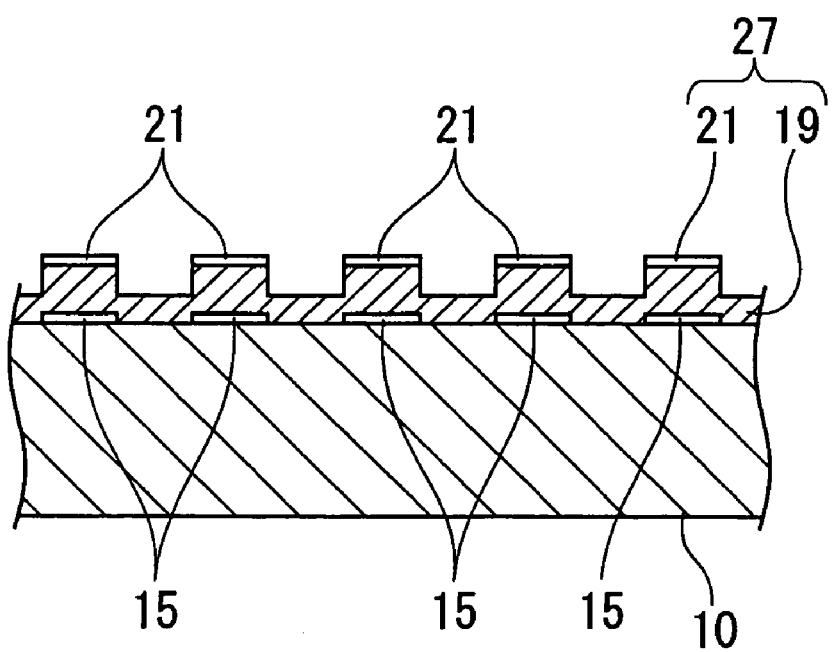

Among the convex portions (the continuous convex portion) 19 that are formed continuously so as to extend for plurality of mutually adjacent external connection terminals 27, it is preferable that the height between adjacent external connection terminals 27 be lower in portions than the height of the external connection terminals 27. FIG. 3B is a cross-sectional view taken across a line B-B' in FIG. 1 in a case in which, among the convex portions 19 that are formed continuously so as to extend for plurality of mutually adjacent external connection terminals 27, the height between adjacent external connection terminals 27 is lower in portions than the height of the external connection terminals 27.

(Method of Manufacturing a Liquid Crystal Panel)

Next, a description will be given of a method of forming the above described liquid crystal panel 25 with reference made to FIG. 4A through FIG. 8B.

FIGS. 4B, 5B, 6B, 7B and 8B are cross-sectional views taken along a line A-A in each of FIGS. 4A, 5A, 6A, 7A and 8A.

FIGS. 4C, 5C, 6C, 7C and 8C are cross-sectional views taken along a line B-B in each of FIGS. 4A, 5A, 6A, 7A and 8A.

Firstly, a step of forming the wires 15, a step of forming the convex portions 19, and a step of forming the conductive layers 21 in the present embodiment will be described. Subsequently, a painting step in which the sealing material 23 is painted on the first substrate 10, a preliminary curing step to cure the painted sealing material 23, a liquid crystal placement step in which a liquid crystal 25 is placed in an area on the substrate that is surrounded by the sealing material 23, a step in which the respective substrates are adhered together via the sealing material 23, and a sealing material curing step in which the sealing material 23 is cured using ultraviolet light irradiation. Note that a step for forming a TFT can be provided prior to the wire formation step, however, because a known step is used for forming the TFT and the like, a description thereof is omitted in the present embodiment. In addition, prior to the sealing material 23 painting step, an alignment step is provided in which alignment marks are formed such that the sealing material 23 and the liquid crystal 25 can be painted or coated in predetermined positions, and the substrates are then positioned based on these alignment marks, however, here, a description of the alignment step is omitted.

Firstly, a silicon oxide film ($SiO_2$) is formed on a surface of the first substrate 10 using a chemical vapor deposition (CVD) method. The film thickness of this silicon oxide film is, for example, approximately 200 nm.

Next, the plurality of wires 15 are formed using a photolithographic method in a predetermined pattern on the first substrate 10. Specifically, ITO, or a simple metal substance, an alloy, or a metal silicide or the like containing at least one of Ti, Cr, W, Ta, Mo, and Pb is accumulated on the surface of the first substrate 10 including the protruding area 17 using a sputtering method, a CVD method, an electron beam thermal evaporation method or the like. Next, resist is coated on this metal film using a spin coating method, a dipping method, a spray coating method or the like. A mask is then transferred in a predetermined pattern onto the resist using laser light or the like. The wires 15 that are formed on the protruding area 17 are formed in a predetermined pattern so as to correspond to the placement of the electrodes of the liquid crystal drive IC 30 that is being packaged. Next, exposure processing and developing processing are performed so that the resist is patterned in a predetermined configuration.

Next, the metal or the like that is placed in the area formed in a predetermined pattern where the resist has been removed by the aforementioned exposure processing and developing processing is etched. Namely, using the resist that is formed in a predetermined pattern as a mask, portions where the metal or the like is exposed are removed. Next, resist that is remaining on the metal or the like is peeled off. Note that the etching may be performed using any of a variety of methods such as dry etching, wet etching, or plasma etching.

By performing the etching processing in this manner, the wires 15 can be formed in a predetermined pattern.

Next, the convex portions 19 are formed on each of the plurality of wires 15 that are formed in a predetermined pattern by a method described above. Note that FIGS. 4A to 8C shown below are partial enlarged views showing a portion of the protruding area 17 in enlargement in order to simplify understanding of the steps for forming the convex portions 19 and the conductive layers 21.

Figure 4A:
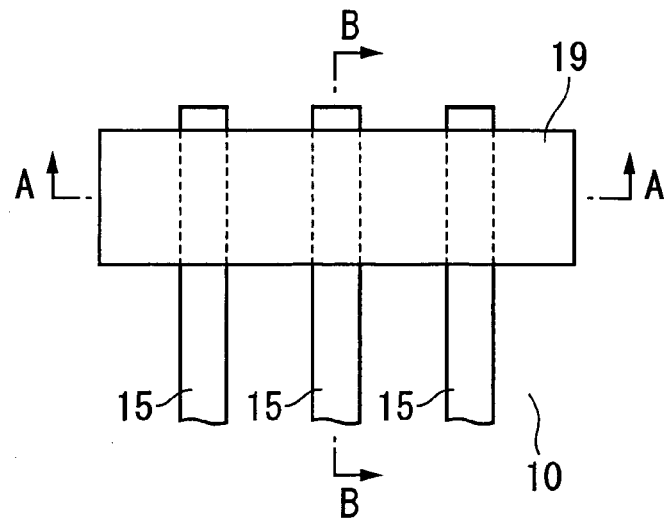
FIGS. 4A to 4C are diagrams showing methods of forming a convex portion using a photolithographic method.
Figure 4B:
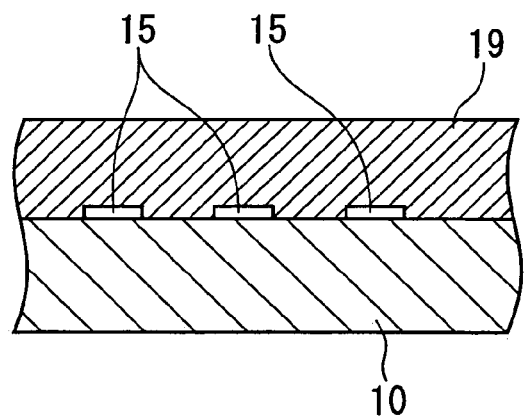
Figure 4C:
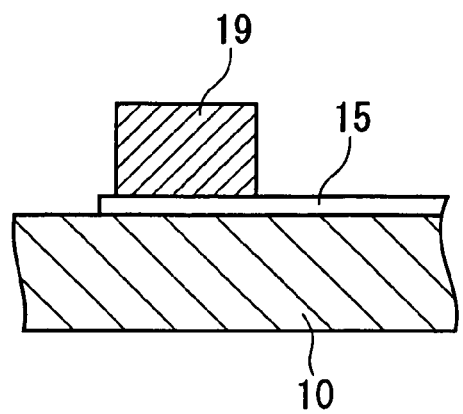
Figure 5A:
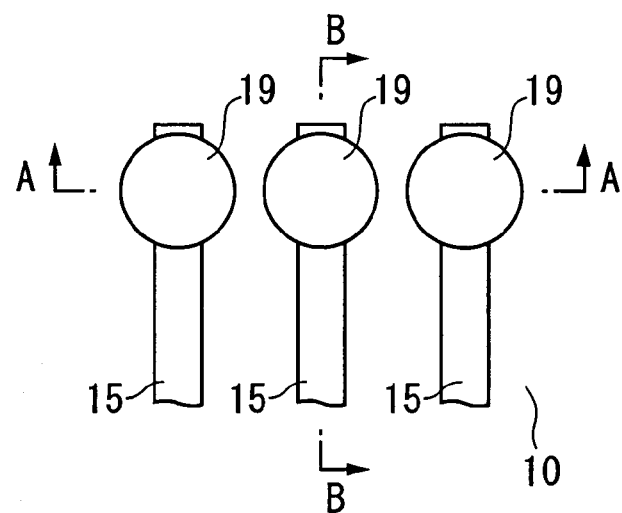
FIGS. 5A to 5C are diagrams showing methods of forming a convex portion using a photolithographic method.
Figure 5B:
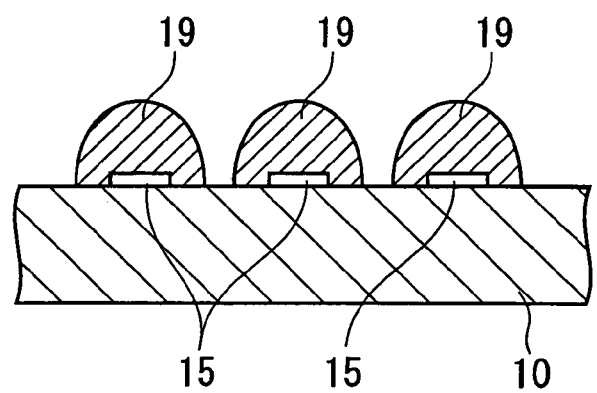
Figure 5C:
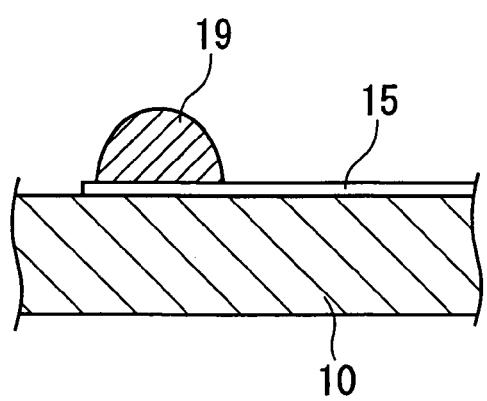

Firstly, as shown in FIGS. 4A to 4C, resin is coated on an area that includes at least one end of the plurality of wires 15 that are formed on the protruding area 17. Next, as shown in FIGS. 5A to 5C, exposure processing, developing processing, and curing processing are performed so that the convex portions 19 are formed in a hemispherical shape on one end of each of the wires 15 that are formed in a predetermined pattern. By controlling the exposure, developing, and curing conditions, smooth, hemispherical convex portions 19 can be formed.

Figure 6A:
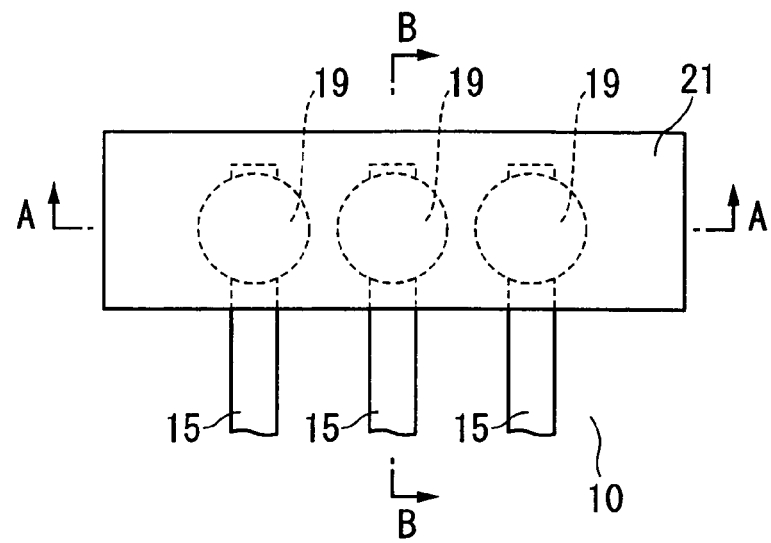
FIGS. 6A to 6C are diagrams showing methods of forming a conductive layer using a photolithographic method.
Figure 6B:
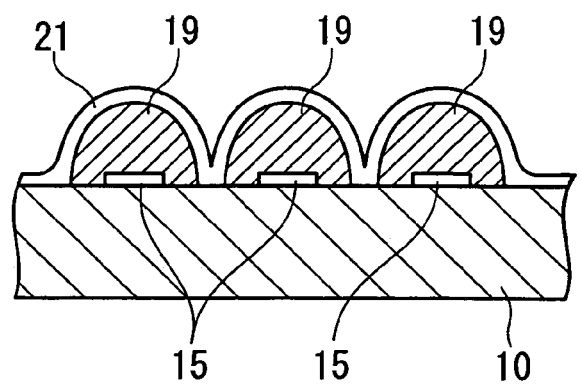
Figure 6C:
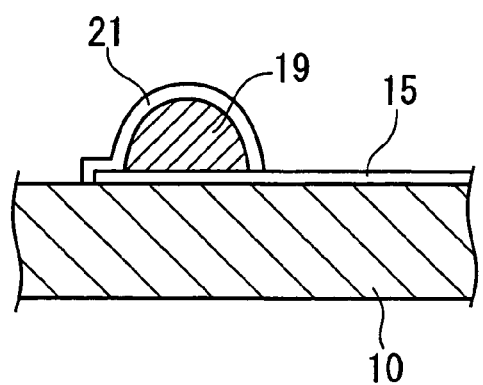

Next, As shown in FIGS. 6A to 6C, a conductive layer 21 is formed on areas that include the wires 15 that have been formed using an aforementioned method and the convex portions 19 that have been formed on the wires 15. The conductive layer 21 is formed by a sputtering method or plating method over the entire surface including the wires 15 and the convex portions that are formed on the wires 15. Note that, if plating method is performed, the layer formed in the plating step constitutes the seed layer.

Figure 7A:
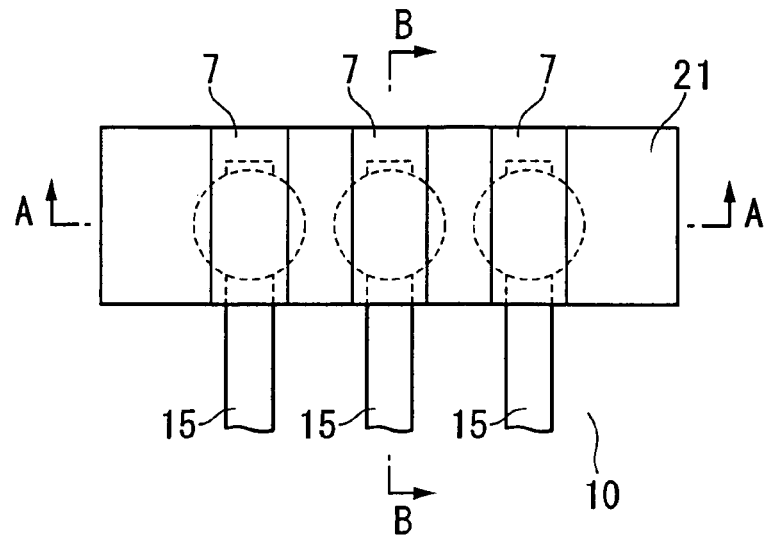
FIGS. 7A to 7C are diagrams showing methods of forming a conductive layer using a photolithographic method.
Figure 7B:
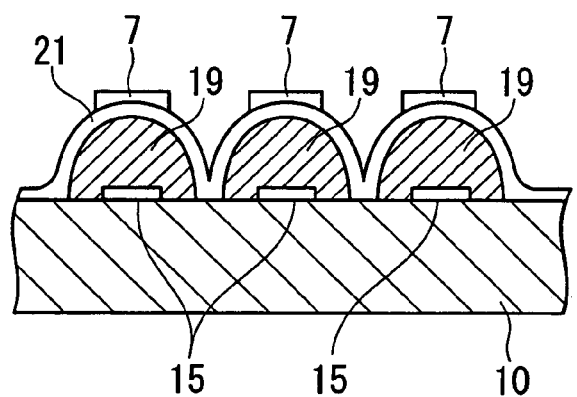
Figure 7C:
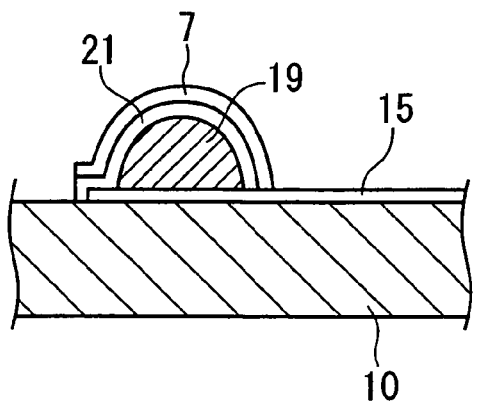

Next, as shown in FIGS. 7A to 7C, resist 7 is coated on the entire surface of the above described conductive layer 21 using a method such as a spin coating method, a dipping method, a spray coating method or the like. After this, exposure processing and developing processing are performed, and a mask pattern in which apertures are formed that correspond to the planar shape (i.e., to the planar pattern) of the conductive layer 21 is transferred onto the conductive layer 21. The resist 7 is then patterned in a predetermined shape. Note that, if a plating method is used to form the conductive layer 21, then plating processing is performed on the seed layer on which the resist 7 is patterned.

Figure 8A:
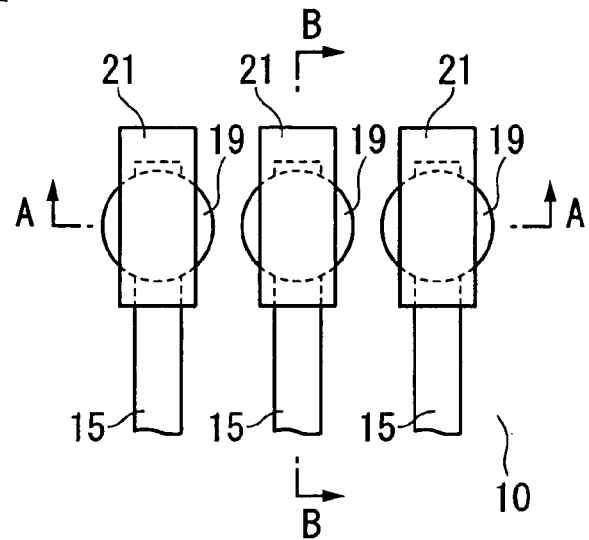
FIGS. 8A to 8C are diagrams showing methods of forming a conductive layer using a photolithographic method.
Figure 8B:
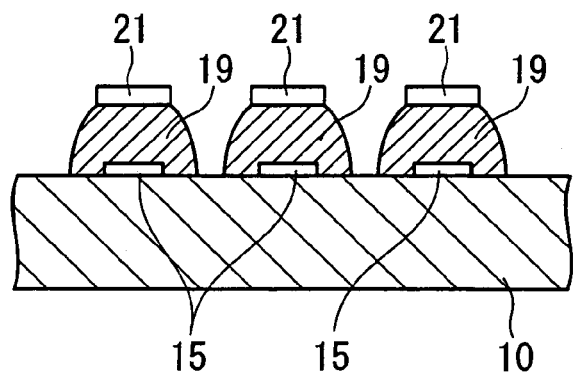
Figure 8C:
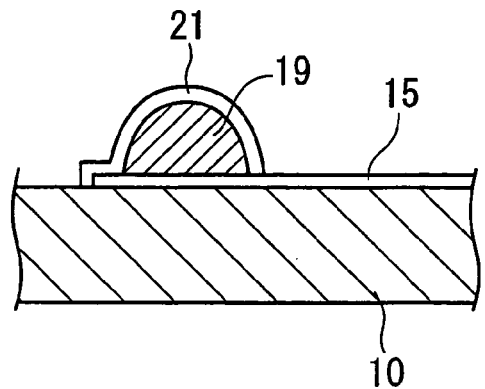

Next, as shown in FIGS. 8A to 8C, the conductive layer 21, which has been placed in the area that has been formed in a predetermined pattern from which the resist 7 has been removed by the above described exposure processing and developing processing, is etched. Namely, using the resist 7 that is formed in a predetermined pattern as a mask, portions where the conductive layer 21 is exposed are removed. Next, the resist 7 that is remaining on the conductive layer 21 is peeled off. Note that the etching may be performed using any of a variety of methods such as dry etching, wet etching, or plasma etching.

By performing the etching processing in this manner, it is possible to form conductive layers 21 in a predetermined pattern such that they cover a portion of the surface of the convex portions 19. At this time, the conductive layers 21 that are formed on the surface of the convex portions 19 are electrically connected to the wires 15.

Next, the sealing material 23 is painted on the first substrate 10. The sealing material 23 is painted in a closed toroidal configuration that does not include the liquid crystal injection apertures using a dispensing method, a printing method, and inkjet method or the like. The material used for the sealing material 23 is an epoxy based or acrylic based resin having viscosity, and a resin that can be cured by ultraviolet light or that can be cured by heat is used.

Once the sealing material 23 has been painted, after between 10 and 120 seconds have elapsed, a preliminary curing step is performed on the sealing material 23. In this preliminary curing step, the sealing material 23 is heated, for example, to a temperature of 80° C. to 120° C. for between 15 and 60 seconds using any of a variety of heating apparatuses such as a hot plate. It is also possible to cure the sealing material 23 using ultraviolet light irradiation, however, in the preliminary curing step, it is necessary to cure the sealing material 23 to an appropriate degree while maintaining the elasticity and adhesiveness thereof, and applying heat in the preliminary curing step is preferable as curing the sealing material using heat enables minute adjustments to be made to the degree to which the sealing material 23 is cured.

Next, the liquid crystal 25 is coated on the first substrate 10 within an area surrounded by the sealing material 23. Known technology such as an inkjet method can be used for the method of coating the liquid crystal 25. A TN type of STN type of material can be used for the liquid crystal material.

After the liquid crystal placement step, the first substrate 10 and the second substrate 13 are adhered together via the already formed sealing material 23. The pressure that is applied during the adhesion is, for example, approximately $10^5$ Pa.

Next, after the substrates have been adhered, curing processing is performed on the sealing material 23. In the sealing material 23 curing step, methods can be used that employ a variety of apparatuses such as UV lamps, heating apparatuses, and visible light irradiation apparatuses, however, in the present embodiment, the sealing material 23 is cured by ultraviolet light irradiation using a UV lamp. The ultraviolet light irradiation is performed in irradiation conditions of, for example, approximately 2000 mJ/cm$^2$ to 10000 mJ/cm$^2$.

The above described liquid crystal panel 25 can be manufactured by steps such as those described above.

According to the above described structure, because a step is provided in which convex portions 19 made of resin are formed on the first substrate 10, it is possible to absorb stress in the liquid crystal drive IC 30 or liquid crystal panel 25 when the liquid crystal drive IC 30 is being packaged on the first substrate 10. As a result, malfunctions in the packaging of the liquid crystal drive IC 30 can be avoided, and it is possible to achieve an improvement in the connection reliability.

Moreover, in the present embodiment because the convex portions 19 are formed using a photolithographic method, the convex portions 19 can be formed accurately and with a high degree of precision in predetermined positions on the first substrate 10. In addition, by controlling the exposure, developing and curing conditions, it is possible to form smooth, hemispherical convex portions 19.

SECOND EMBODIMENT

In the above described the first embodiment, thin films are manufactured using a sputtering method, and these manufactured thin films are formed into wires 15, convex portions 19, and conductive layers 21 in a predetermined pattern using a photolithographic method. In contrast to this, in the present embodiment, instead of the above described formation method that is based on a photolithographic method, the wires 15, convex portions 19, and conductive layers 21 are formed using an inkjet method. A description is given below in detail of the structure of an inkjet apparatus and of a method of forming the wires 15, convex portions 19, and conductive layers 21. Note that because the painting step in which the sealing material 23 is painted on the first substrate 10, the preliminary curing step to cure the painted sealing material 23, the liquid crystal placement step in which the liquid crystal 25 is placed in an area on the substrate that is surrounded by the sealing material 23, the step in which the respective substrates are adhered together via the sealing material 23, and the sealing material curing step in which the sealing material 23 is cured using ultraviolet light irradiation are performed using the same methods as in the above described first embodiment, a description thereof is omitted here.

(Structure of an Inkjet Apparatus)

Firstly, a description of an inkjet apparatus 60 that is used to perform the processes to form the wires 15, the convex portions 19, and the conductive layers 21 will be given.

Figure 9:
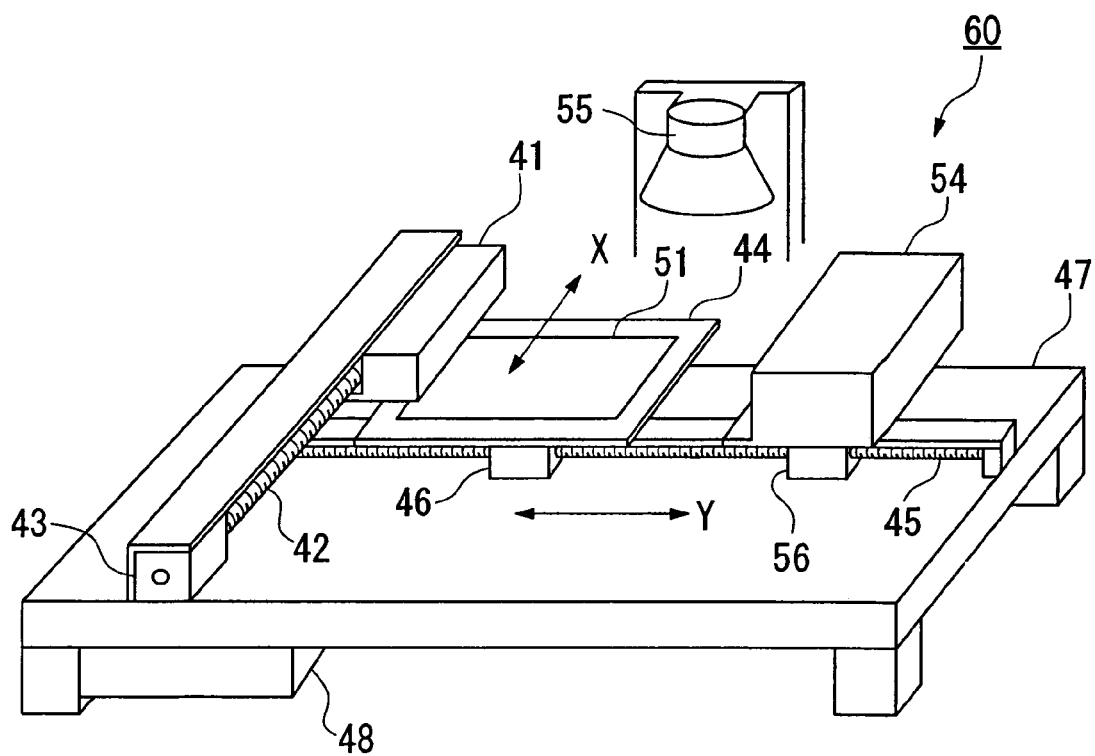
FIG. 9 is a schematic structural view of an inkjet apparatus.

FIG. 9 is a schematic perspective view of the inkjet apparatus 60 according to the present embodiment. As shown in FIG. 9, the inkjet apparatus 60 is provided with an inkjet head group 41, an X direction guide shaft 42 that is used to drive the inkjet head group 41 in an X direction, and an X direction drive motor 43 that rotates the X direction guide shaft 42. In addition, the inkjet apparatus 60 is provided with a mounting base 44 on which a substrate 51 is mounted, a Y direction guide shaft 45 that is used to drive the mounting base 44 in a Y direction, and a Y direction drive motor 46 that rotates the Y direction guide shaft 45. There is also provided a base 47, and the X direction guide shaft 42 and the Y direction guide shaft 45 are both fixed to predetermined positions on the base 47. A control unit 48 is provided underneath the base 47. A cleaning mechanism section 54 and a heater 55 are also provided.

The inkjet head group 41 is provided with a plurality of inkjet heads that discharge a dispersion solution that contains fine conductive grains from nozzles (i.e., discharge apertures) and supply them to the substrate at predetermined spacings. It is possible for the dispersion solution to be discharged individually from each of the plurality of inkjet heads in accordance with a discharge voltage that is supplied from the control unit 48. The inkjet head group 41 is fixed to the X direction guide shaft 42, and the X direction drive motor 43 is connected to the X direction guide shaft 42. The X direction drive motor 43 is a stepping motor or the like. When the X direction drive motor 43 receives an X direction drive pulse signal from the control unit 48, it rotates the X direction guide shaft 42. When the X direction guide shaft 42 is rotated, the inkjet head group 41 moves in the X axial direction along the base 47.

Figure 10A:
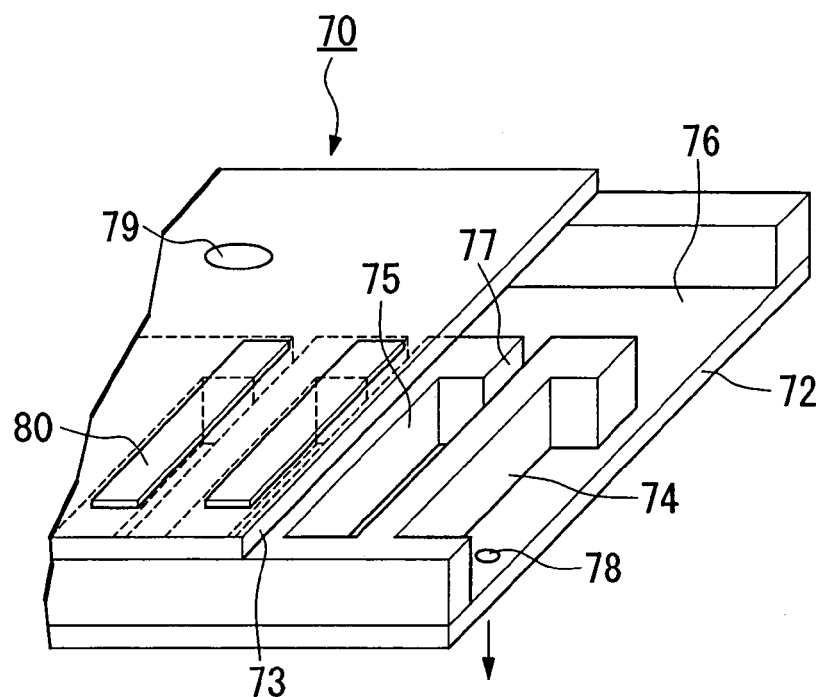
Figure 10B:
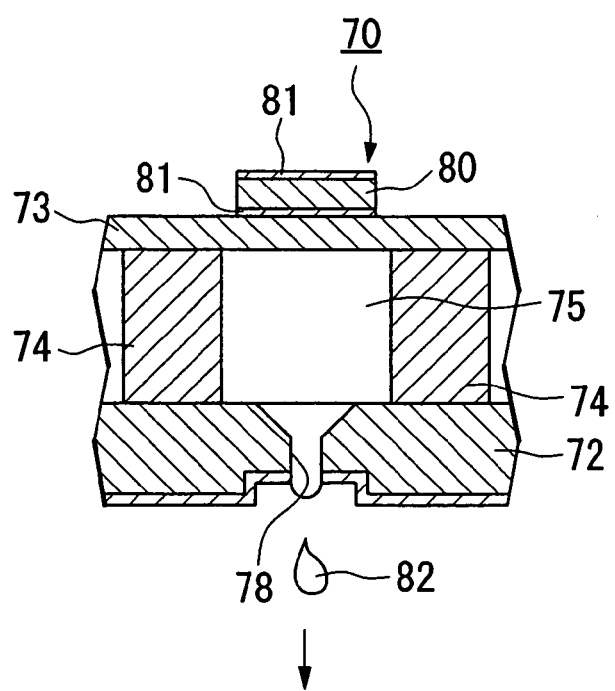
FIG. 10B is a cross-sectional view of FIG. 10A.

Here, the plurality of inkjet heads that make up the inkjet head group 41 will be described in detail. FIG. 10A and 10B are views showing an inkjet head 70.

As shown in FIG. 10A, the inkjet head 70 is provided with a nozzle plate 72 formed from, for example, stainless steel and a diaphragm 73, and these two are joined together via a partitioning member (i.e., a reservoir plate) 74. A plurality of spaces 75 and a solution container 76 are formed by the partitioning members 74 between the nozzle plate 72 and the diaphragm 73. The interiors of each space 75 and of the solution container 76 are filled with a liquid, and the respective spaces 75 and the solution container 76 are connected together via supply ports 77. A plurality of nozzle holes 78 are formed in rows running in the vertical and horizontal directions in the nozzle plate 72, and the liquid is discharged from the spaces 75 via these nozzle holes 78. A hole 79 that is used to supply the liquid to the solution container 76 is formed in the diaphragm 73.

As shown in FIG. 10B, a piezoelectric element 80 is joined onto the surface of the diaphragm 73 on the opposite side to the surface thereof that faces the spaces 75. This piezoelectric element 80 is positioned between a pair of electrodes 81, and a structure is employed in which, when energized, the piezoelectric element 80 flexes so as to protrude outwards. As a result of this structure, the diaphragm 73 to which the piezoelectric element is joined also flexes outwards at the same time integrally with the piezoelectric element 80. Consequently, the volume of the space 75 increases. Accordingly, liquid corresponding to the amount of the increase in the volume of the space 75 flows into the space 75 from the solution container 76 via the supply port 77. When the energizing of the pizza electric element 80 is terminated in this state, the piezoelectric element 80 and the diaphragm 73 both return to their original figurations. Accordingly, because the space 75 is also restored to its original volume, the pressure of the liquid inside the space 75 is raised, and droplets 82 of this liquid are discharged from the nozzle hole 78 towards a substrate.

Figure 11:
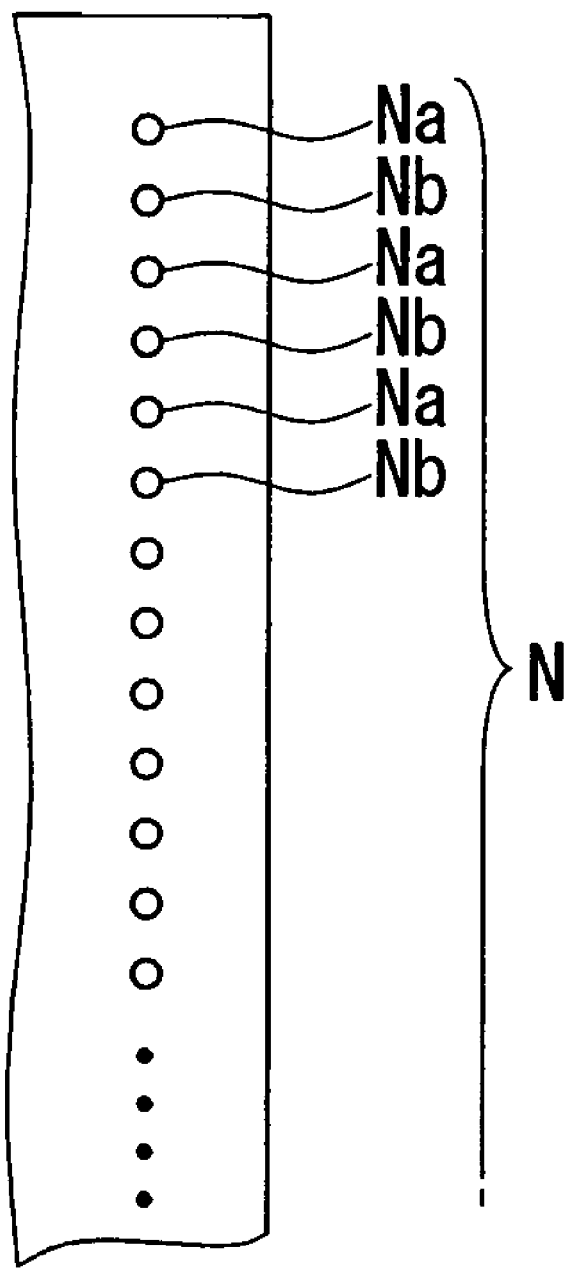
FIG. 11 is a bottom surface view of an inkjet head.

Note that, because an inkjet head 70 that has the structure described above has a substantially rectangular bottom surface, as shown in FIG. 11, nozzles N (i.e., the nozzle holes 78) are arranged on the rectangle so as to be positioned equidistantly in a vertical direction. In the present example, every second nozzle from among all of the nozzles of the row of nozzles that are arranged in this vertical direction, namely in the longitudinal direction, is taken as a main nozzle (i.e., a first nozzle) Na, and the nozzles positioned between these main nozzles Na are taken as sub-nozzles (i.e., second nozzles) Nb.

A piezoelectric element 70 is provided independently for each of the respective nozzles N (i.e., the nozzles Na and Nb), so that a discharge operation can be performed independently for each nozzle N. Namely, by controlling the discharge waveform in the form of the electrical signals that are sent to these piezoelectric elements 70, the quantity of the droplets that are discharged from each of the nozzles N can be regulated and changed. Here, this control of the discharge waveform is carried out by the control unit 48, and as a result of this type of structure being employed, the control unit 48 is also able to function as a discharge quantity adjusting device that changes the quantity of droplets that are discharged from each of the nozzles N.

Note that the type of inkjet head 70 is not limited to a piezo-jet type that uses the piezoelectric element 80, and, for example, it is also possible to use a thermal type. In this case, by changing the application time, the quantity of droplets that are discharged can be changed.

Returning to FIG. 9, the mounting base 44 is used to mount a substrate 51 onto which the dispersion solution is supplied from the inkjet head apparatus 60, and is provided with a mechanism for fixing the substrate 51 in a reference position. The mounting base 44 is fixed to the Y direction guide shaft 45, and Y direction drive motors 46 and 56 are connected to the Y direction guide shaft 45. The Y direction drive motors 46 and 56 are stepping motors or the like. When the Y direction drive motors 46 and 56 receive a Y direction drive pulse signal from the control unit 48, they rotate the Y direction guide shaft 45. When the Y direction guide shaft 45 is rotated, the mounting base 44 moves in the Y axial direction along the base 47.

The cleaning mechanism section 54 is provided with a mechanism that cleans the inkjet head group 41. The cleaning mechanism section 54 is able to be moved along the Y direction guide shaft 45 by the Y direction drive motor 56. The movement of the cleaning mechanism section 54 is also controlled by the control unit 48.

Here, the heater 55 is an apparatus for performing heating processing on the substrate 51 by lamp annealing. The heater 55 vaporizes and dries liquid that has been discharged onto the substrate, and also performs heat processing in order to convert it into a conductive film. The turning on and off of the power supply of the heater 55 is also controlled by the control unit 48.

In the inkjet apparatus 60 of the present embodiment, in order to discharge a dispersion solution onto a predetermined wire formation area, predetermined drive pulse signals are sent from the control unit 48 to the X direction drive motor 43 and/or the Y direction drive motor 46, so as to move the inkjet head group 41 and/or the mounting base 44. As a result, the inkjet head group 41 and the substrate 51 (i.e., the mounting base 44) are moved relatively to each other. During this relative movement, discharge voltage is supplied from the control unit 48 to predetermined inkjet heads 70 in the inkjet head group 41 so that dispersion solution is discharged from these inkjet heads 70.

In the inkjet apparatus 60 of the present embodiment, the quantity of droplets that are discharged from each inkjet head 70 of the inkjet head group 41 can be adjusted by changing the size of the discharge voltage that is supplied from the control unit 48. The pitch of the droplets that are discharged onto the substrate 51 is determined by the relative speed of the inkjet head group 44 relative to the substrate 51 (i.e., to the mounting base 44), and by the discharge frequency (i.e., the frequency of the supply of discharge voltage) from the inkjet head group 44.

According to the inkjet apparatus 60 of the present embodiment, droplets 82 of a liquid material can be discharged accurately onto predetermined positions, and the wires 15, convex portions 19, and conductive layers 21 can be formed by the minimum amount necessary of droplets 82 of liquid material. In addition, according to the inkjet apparatus 60, finer wires and thinner films can be achieved without any bulges being generated, and it is possible to form wires 15, convex portions 19, and conductive layers 21 that have a uniform film thickness.

(Method of Forming the Wires)

Next, a method of forming the wires 15 using the above described inkjet apparatus 60 will be described with reference made to FIGS. 12A to 12C. Firstly, in order to control the spread of moisture from the droplets 82 of liquid material, repellency processing and lyophilicization processing are performed on the first substrate.

Figure 12A:
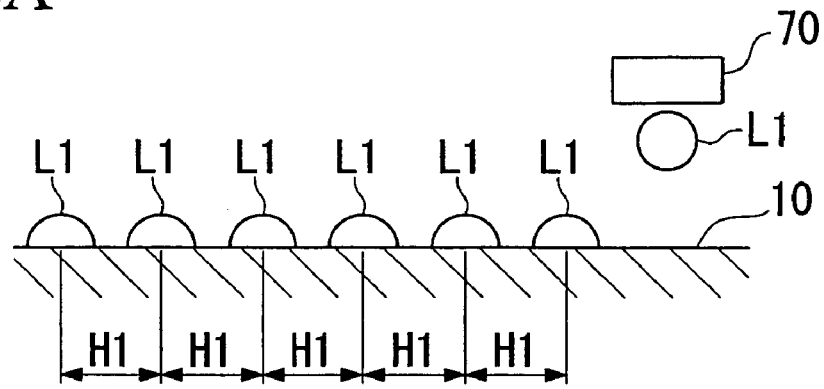
FIGS. 12A to 12C are diagrams showing a method of forming wiring using inkjet method.

Next, as shown in FIG. 12A, the inkjet apparatus 60 discharges droplets L1 of a liquid material that has been obtained by dissolving or dispersing fine, conductive particles in a dispersion medium onto the first substrate from the nozzle hole 78 of the inkjet head 70. Specifically, the inkjet apparatus 60 sequentially discharges the droplets L1 of liquid material onto predetermined positions while relatively moving the inkjet head 70 so as to correspond to a predetermined plurality of wiring patterns. The inkjet apparatus 60 places the droplets L1 of liquid material on the first substrate 10 with a predetermined spacing between each such that they do not overlap. Note that the placement pitch H1 between the droplets L1 of liquid material is set so as to be larger than the diameter of the droplets L1 of liquid material immediately after they have been placed on the first substrate 10. As a result, the droplets L1 of liquid material do not overlap (i.e., come into contact with) each other immediately after being placed on the first substrate 10, and it is possible to prevent the droplets L1 of liquid material from combining and spreading moisture over the first substrate 10.

Next, the heater 55 that has been installed in the inkjet apparatus 60 performs heat processing on the wires 15 that are formed in a predetermined pattern, as described above, in order to improve the potential contact between the fine particles. As a result of this, it is possible to remove the dispersion medium contained in the droplets 82 of liquid material. The heat processing can be performed by using any of a variety of apparatuses in addition to the aforementioned heater 55, such as a hotplate, an electric furnace, a hot air generator and the like. Moreover, instead of the above described heat processing, it is preferable that light processing by lamp annealing be performed.

Figure 12B:
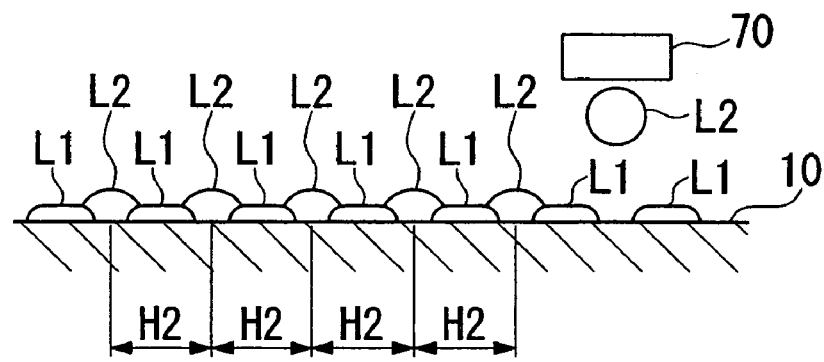

Next, as shown in FIG. 12B, the inkjet apparatus 60 shifts by one half of a pitch from the placement positions of the previous discharge, and then discharges droplets L2 of liquid material onto the first substrate 10. Namely, the droplets L2 of liquid material are sequentially discharged onto and thereby placed in intermediate positions between the placement positions of the previous discharge. As described above, the placement pitch H1 of the droplets L1 of liquid material on the first substrate 10 is greater than the diameter of the droplets of liquid material L1 immediately after they have been placed on the first substrate 10, and is also less than twice this diameter. Consequently, as a result of the droplets of liquid material L2 being placed at intermediate positions between the droplets of liquid material L1, a portion of the droplets of liquid material L2 overlap with the droplets of liquid material L1, and fill the gaps between adjacent droplets L1 of liquid material. At this time, the current droplets L2 of liquid material come into contact with the previous droplets L1 of liquid material, however, because the dispersion medium has already been completely or substantially removed from the previous droplets L1 of liquid material, the two do not combine and spread over the substrate.

Next, after the droplets L2 of liquid material has been placed on the first substrate 10, heat processing is performed, as required, in the same manner as that performed previously in order to remove the dispersion medium.

Figure 12C:
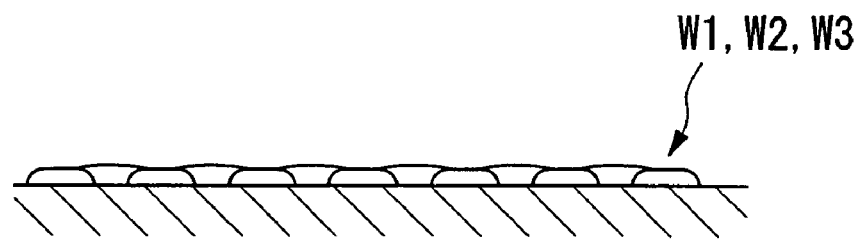

By repeating a series of discharge operations such as this, as shown in FIG. 12C, the gaps between adjacent droplets 82 of liquid material that has been placed on the first substrate 10 are filled, and wires 15 that are formed in a continuous line configuration are formed.

(Method of Forming the Convex Portions)

Next, a method of forming the convex portions 19 will be described. The convex portions 19 are formed using the same method as the above described wire forming method, namely, using the inkjet apparatus 60. The ink jet apparatus 60 discharges from the nozzle hole 78 of the inkjet head 70 droplets of a liquid material that has been obtained by dissolving or dispersing a resin in a dispersion medium onto each of the plurality of wires that are formed in a predetermined pattern. At this time, the quantity of discharged droplets of liquid material that are discharged from the nozzles of the heads of the inkjet apparatus 60 is controlled so that the diameter of the convex portions 19 is greater than the line width of the wires.

Next, the heater 55 that is installed in the inkjet apparatus 60 performs heat processing on the convex portions 19 that are formed in a predetermined pattern, as described above, in order to improve the potential contact between the fine particles. As a result of this, it is possible to remove the dispersion medium contained in the droplets of liquid material. The heat processing can be performed by using any of a variety of apparatuses in addition to the aforementioned heater 55, such as a hotplate, an electric furnace, a hot air generator and the like. Moreover, instead of the above described heat processing, it is preferable that light processing by lamp annealing be performed.

In this manner, the convex portions 19 can be formed on one end of each of the wires that are formed in a predetermined pattern. A plurality of these convex portions 19 are formed on the protruding area 17 so as to correspond to the positions where the electrodes that are formed on the liquid crystal drive IC 30 are to be packaged.

(Method of Forming the Conductive Layer)

Next, a method of forming the conductive layers 21 will be described. The conductive layers 21 are formed using the same method as in the above described wire forming method, namely, using the inkjet apparatus 60.

Firstly, the inkjet apparatus 60 discharges droplets of a liquid material that has been obtained by dissolving or dispersing fine conductive particles in a dispersion medium from the nozzle hole 78 of the inkjet head 41 onto the surface of the convex portions 19 and the top of the wires. By discharging droplets of liquid material in this manner, the conductive layers 21 and the wires 15 are electrically connected.

Next, the heater 55 that is installed in the inkjet apparatus 60 performs heat processing on the conductive layers 21 that are formed in a predetermined pattern, as described above, in order to improve the potential contact between the fine particles. As a result of this, it is possible to remove the dispersion medium contained in the droplets of liquid material. The heat processing can be performed by using any of a variety of apparatuses in addition to the aforementioned heater 55, such as a hotplate, an electric furnace, a hot air generator and the like. Moreover, instead of the above described heat processing, it is preferable that light processing by lamp annealing be performed.

According to the inkjet method that is performed in this manner, finer wires and thinner films can be achieved without any bulges being generated, and it is possible to form wires 15, convex portions 19, and conductive layers 21 that have a uniform film thickness. Moreover, according to this inkjet method, droplets of a liquid material can be discharged accurately onto predetermined positions, and the wires 15, convex portions 19, and conductive layers 21 can be formed by the minimum amount necessary of droplets of liquid material.

THIRD EMBODIMENT

In the embodiments described above, the conductive layers 21 are formed on the surface of the convex portions 19, which is composed of resin, and these conductive layers 21 are electrically connected to the wires 15. In contrast to this, in the present embodiment, the conductive layers 21 are formed on the surface of the convex portions 19 so as to cover the wires 15.

Figure 13A:
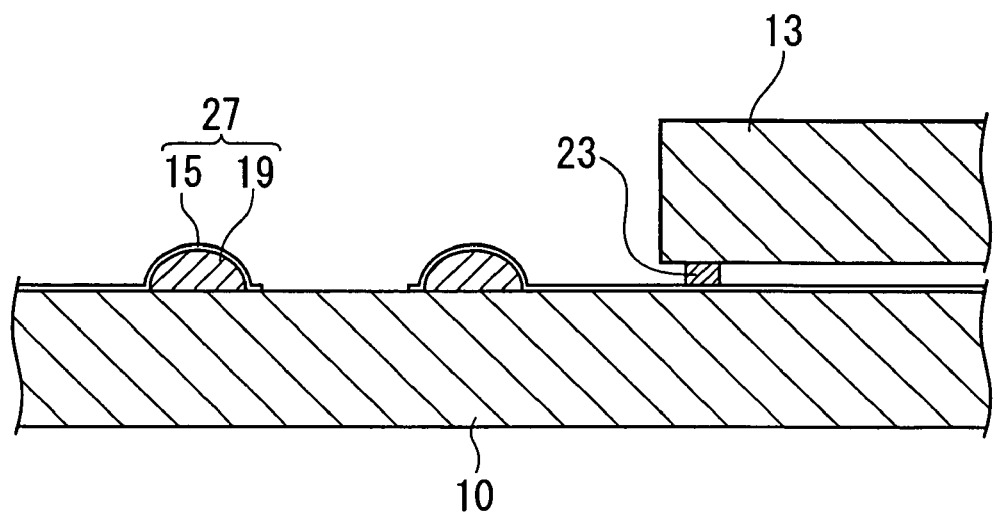
Figure 13B:
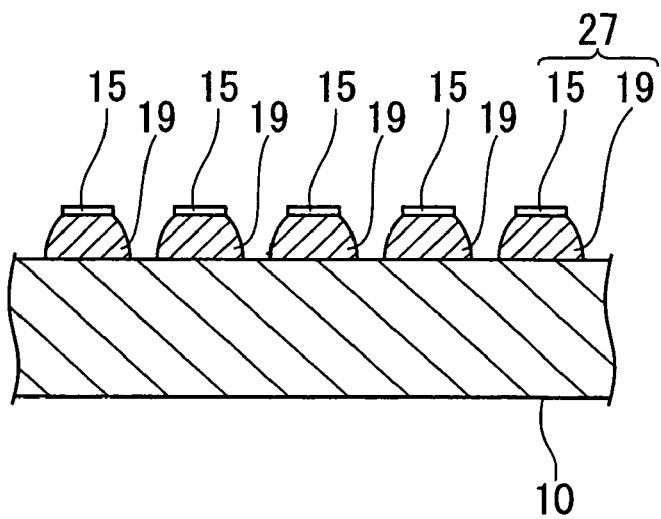
FIG. 13B is a cross-sectional view taken along a line B-B' of a protruding area shown in FIG. 1.

FIG. 13A is a cross-sectional view taken along the line A-A' in FIG. 1 when the wires 15 are formed so as to cover a portion of the surface of the convex portions 19. FIG. 13B is a cross-sectional view taken along the line B-B' in FIG. 1. The wires 15 that are provided on the first substrate 10 are formed on each of the convex portions 19, which are formed individually on the first substrate 10, so as to cover the surfaces of the convex portions 19. Namely, in the present embodiment, the wires 15 are also provided with the functions of the conductive layers 21. In this case, a convex portion 19 and a wire 15 that is formed so as to cover the surface of the convex portion 19 constitute an external connection terminal 27.

As has been described in the first embodiment and second embodiment, a photolithographic method or in inkjet method can be used for the method of forming the external connection terminals 27. A simple explanation is given below only of those points that differ from the first embodiment and second embodiment, and a description of identical portions is omitted.

In a formation method that employs a photolithographic method or an inkjet method, prior to the plurality of wires 15 being formed in a predetermined pattern on the first substrate 10, firstly, a plurality of convex portions 19 are formed on the protruding area 17 of the first substrate 10. These convex portions 19 are placed on the protruding area 17 so as to correspond to positions where electrodes formed on a liquid crystal drive IC 30 are to be packaged. Next, the plurality of wires 15 are formed in a predetermined pattern on an area that includes the surfaces of the convex portions 19.

Figure 14A:
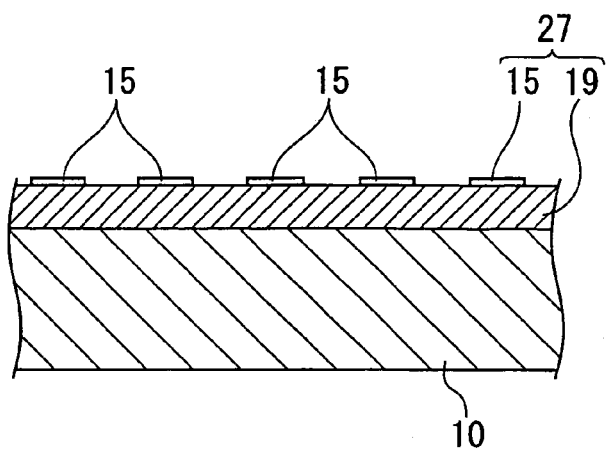
FIGS. 14A and 14B are other cross-sectional views taken along a line B-B' of a protruding area shown in FIG. 1.

Note that it is preferable that the convex portions 19 be formed continuously so as to extend for a plurality of mutually adjacent external connection terminals 27. FIG. 14A is a cross-sectional view taken across a line B-B' in FIG. 1 when the convex portions 19 are formed continuously so as to extend for a plurality of mutually adjacent external connection terminals 27.

Figure 14B:
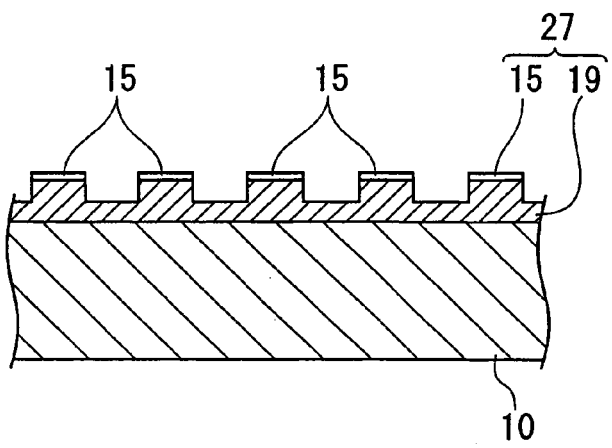

Furthermore, among the convex portions 19 that are formed continuously so as to extend for plurality of mutually adjacent external connection terminals 27, it is preferable that the height of convex portions 19 located between adjacent external connection terminals 27 be lower in portions than the height of the convex portions 19 located in the external connection terminals 27. FIG. 14B is a cross-sectional view taken along a line B-B' of the protruding area 17 shown in FIG. 1 in a case in which the height of the convex portions 19 located between adjacent external connection terminals 27 is formed lower than the portions in the external connection terminals 27.

(Liquid Crystal Display Apparatus)

Figure 15:
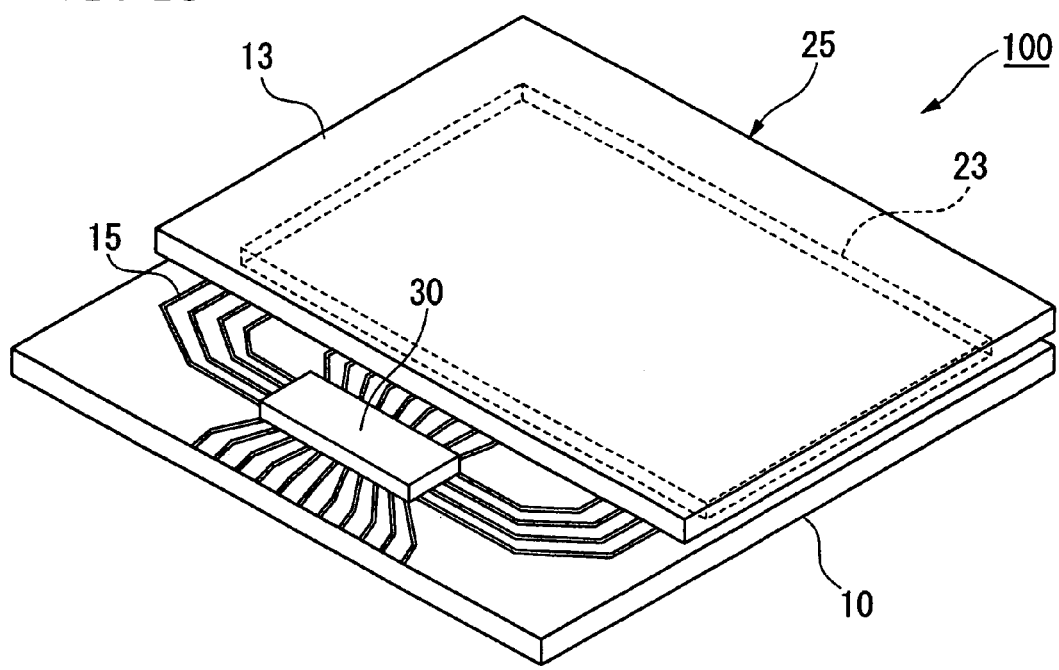
FIG. 15 is a schematic structural view of a liquid crystal display apparatus.

Next, a description will be given with reference made to FIG. 15 of a liquid crystal display apparatus 100 that is provided with the above described liquid crystal panel 25, which is an example of an electro-optical apparatus. Note that because the liquid crystal panel 25 is displayed in detail above, a description thereof is omitted here.

In the liquid crystal display apparatus 100, a liquid crystal drive IC 30 that drives a pixel electrode or the like is chip-on-glass (COG) packaged on the protruding area 17 on the first substrate 10 of the above described liquid crystal panel 25. As a result, connecting terminals of the liquid crystal drive IC 30 and the conductive layers 21 that are formed on the surfaces of the convex portions 19 that are formed from resin on the first substrate 10 are electrically connected via a non-conductive film (NCF, an adhesive agent) or the like.

Note that a variety of methods can be used to package the liquid crystal drive IC 30 and the like on the liquid crystal display apparatus 100, such as a method in which a separate circuit substrate is connected to the liquid crystal panel 25, and the liquid crystal drive IC 30 is chip-on-film (COF) packaged on this circuit substrate. A structure is also employed in which display control signals and the like can be received from an external instrument that is different from this liquid crystal display apparatus 100. It is also preferable that non-electrolytic Ni bumps be formed on the surface of the electrodes of the liquid crystal drive IC 30.

(Electronic Apparatus)

Next, a description will be given of an example in which the electro-optical apparatus of the present invention is used in an electronic apparatus.

Figure 16:
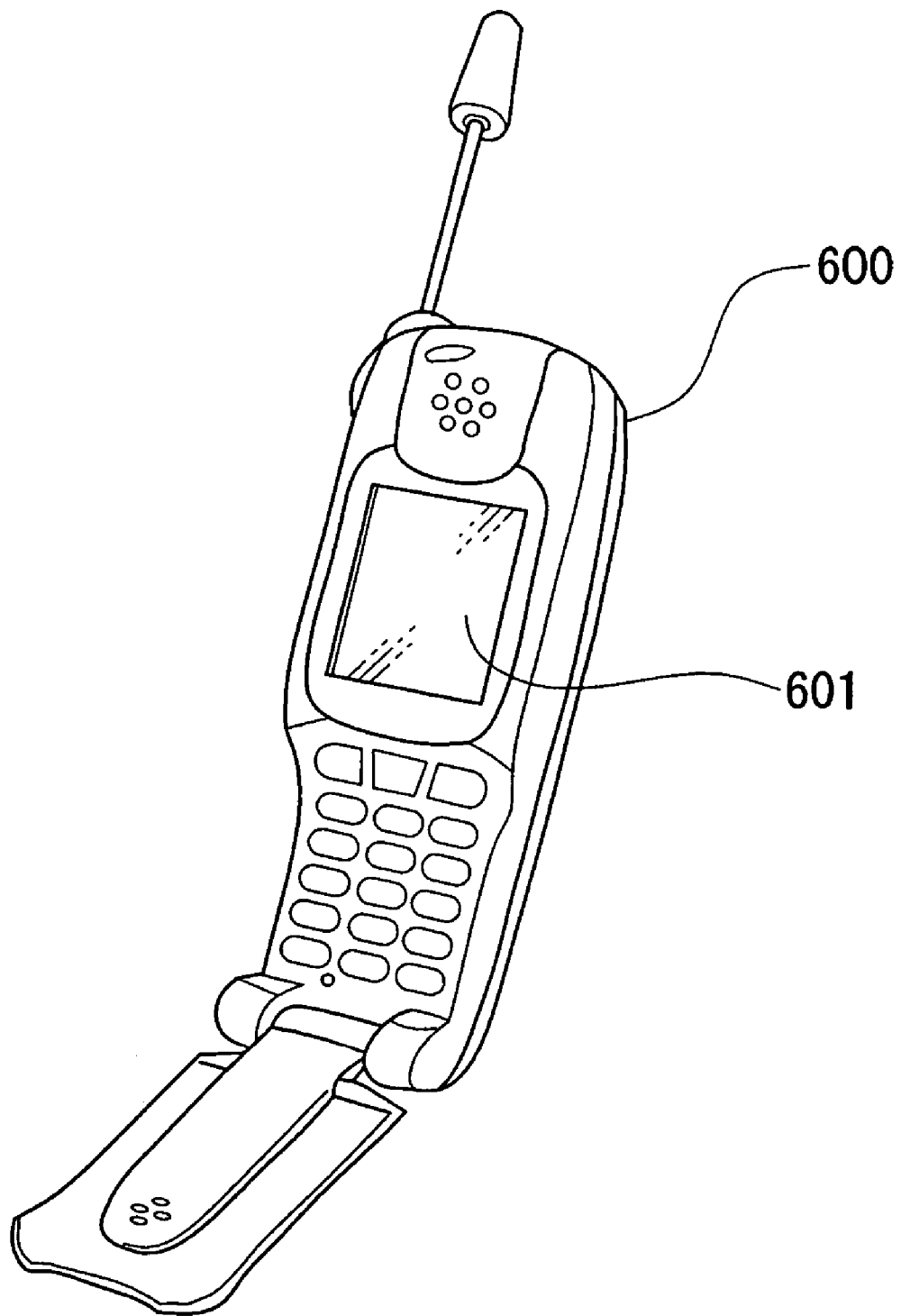
FIG. 16 is a schematic structural view showing an electronic apparatus of the present invention.

FIG. 16 is a perspective view showing an example of a mobile telephone. In FIG. 16, the symbol 600 shows a mobile telephone body, and the symbol 601 shows a display unit that is provided with the liquid crystal display apparatus 100 of the above described embodiments.

Because the electronic apparatus shown in FIG. 16 is provided with the liquid crystal display apparatus 100 of the above described embodiments, there are few malfunctions in the packaging of the liquid crystal drive IC 30, and a higher level of product quality is achieved.

Note that the electronic apparatus of the present embodiments is provided with the liquid crystal display device 100, however, the electronic apparatus may also be one that is provided with another electro-optical apparatus such as an organic EL apparatus, a plasma type display apparatus and the like.

The present invention is not limited to the above described embodiments, and various modifications can be made insofar as they do not depart from the scope of the appended claims.

For example, in the above described embodiments, the liquid crystal drive IC 30 is packaged on the first substrate 10 via a conductive paste or the like that does not contain conductive particles in the adhesive agent, however, it is preferable that an adhesive agent that does contain conductive particles be used.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as limited by the foregoing description and is only limited by the scope of the appended claims.

What is claimed is:

1. A panel for an electro-optical apparatus, comprising:
a substrate;
a plurality of wires formed on the substrate, the wires being spaced apart in a first direction from each other;
protruding portions formed from resin and provided either on the plurality of wires or on the substrate;
conductive layers provided so as to cover a portion of the surfaces of the protruding portions, and that are electrically connected to the respective wires; and
a plurality of external connection terminals for electrically connecting electronic components, formed by the protruding portions and the conductive layers, the external connection terminals being arranged on a line along the first direction,
wherein an object, which is located between adjacent external connection terminals in the first direction, has a height smaller than a height of the protruding portions at the external connection terminals.

2. A panel for an electro-optical apparatus, according to claim 1, wherein the protruding portions are formed separated from each other in the first direction with one protruding portion formed for each external connection terminal.

3. A panel for an electro-optical apparatus, according to claim 1, wherein the protruding portions form a continuous protruding portion extending in the first direction over a plurality of mutually adjacent external connection terminals.

4. A panel for an electro-optical apparatus, according to claim 3, wherein, at least in a portion of the continuous protruding portion, a height of the continuous protruding portion is lower at a portion located between adjacent external connection terminals in the first direction than at the external connection terminals.

5. An electro-optical apparatus in which an electronic component is packaged via an adhesive agent on the external connection terminals of the panel for an electro-optical apparatus according to claim 1.

6. An electro-optical apparatus according to claim 5, wherein non-electrolytic Ni bumps are formed on an electrode surface of the electronic component.

7. An electro-optical apparatus according to claim 5, wherein the adhesive agent is formed by an adhesive agent that does not contain conductive particles.

8. An electronic apparatus that is provided with the electro-optical apparatus according to claim 5.

9. An electro-optical apparatus according to claim 1, wherein
the conductive layers extend along an extending direction of each of the wires,
the extending direction intersects with the first direction,
each of the conductive layers has two positions located adjacent to both sides of the protruding portions in the first direction,
each of the conductive layers are connected to the wires at least the two position in the first direction.

10. A panel for an electro-optical apparatus, comprising:
a substrate;
protruding portions formed from resin and provided on the substrate;
a plurality of wires provided on the substrate so as to cover at least a portion of the surfaces of the protruding portions, the wires being spaced apart in a first direction from each other; and
a plurality of external connection terminals for electrically connecting electronic components, formed by the protruding portions and the wires, the external connection terminals being arranged on a line along the first direction,
wherein an object, which is located between adjacent external connection terminals in the first direction, has a height smaller than a height of the protruding portions at the external connection terminals.

11. A panel for an electro-optical apparatus, according to claim 10, wherein the protruding portions are formed separated from each other in the first direction with one protruding portion formed for each external connection terminal.

12. A panel for an electro-optical apparatus, according to claim 10, wherein the protruding portions form a continuous protruding portion extending in the first direction over a plurality of mutually adjacent external connection terminals.

13. A panel for an electro-optical apparatus, according to claim 12, wherein, at least in a portion of the continuous protruding portion, a height of the continuous protruding portion is lower at a portion located between adjacent external connection terminals in the first direction than at the external connection terminals.

14. An electro-optical apparatus in which an electronic component is packaged via an adhesive agent on the external connection terminals of the panel for an electro-optical apparatus according to claim 10.

15. An electro-optical apparatus according to claim 14, wherein non-electrolytic Ni bumps are formed on an electrode surface of the electronic component.

16. An electro-optical apparatus according to claim 14, wherein the adhesive agent is formed by an adhesive agent that does not contain conductive particles.

17. An electronic apparatus that is provided with the electro-optical apparatus according to claim 14.

18. An electro-optical apparatus according to claim 10, wherein
the wires extend along a second direction, which intersects with the first direction,
each of the wires has two positions located adjacent to both sides of the protruding portions in the first direction.

19. A method of manufacturing a panel for an electro-optical apparatus, comprising the steps of:
forming a plurality of wires on a substrate, the wires being spaced apart in a first direction;
forming protruding portions composed of resin, either on the plurality of wires or on the substrate;
forming conductive layers that are electrically connected to the respective wires so as to cover a portion of the surfaces of the protruding portions; and
forming a plurality of external connection terminals for electrically connecting electronic components by the protruding portions and the conductive layers, the external connection terminals being arranged on a line along the first direction,
wherein an object, which is located between adjacent external connection terminals in the first direction, has a height smaller than a height of the protruding portions at the external connection terminals.

20. A method of manufacturing a panel for an electro-optical apparatus, according to claim 19, wherein the resin is a photosensitive resin, and the protruding portions are formed by a photolithographic method.

21. A panel for an electro-optical apparatus, manufactured by using the manufacturing method according to claim 19, wherein the protruding portions are formed by a droplet discharge method.

22. A panel for an electro-optical apparatus, manufactured by using the manufacturing method according to claim 19, wherein the conductive layers or the wires are formed by a droplet discharge method.

23. A method of manufacturing a panel for an electro-optical apparatus, comprising the steps of:
forming protruding portions that are composed of resin on a substrate;
forming a plurality of wires on the substrate so as to cover at least a portion of the surfaces of the protruding portions, the wires being spaced apart in a first direction; and
forming a plurality of external connection terminals for electrically connecting electronic components by the protruding portions and the wires, the external connection terminals being arranged on a line along the first direction,
wherein an object, which is located between adjacent external connection terminals in the first direction, has a height smaller than a height of the protruding portions at the external connection terminals.

24. A method of manufacturing a panel for an electro-optical apparatus, according to claim 23, wherein the resin is a photosensitive resin, and the protruding portions are formed by a photolithographic method.

25. A panel for an electro-optical apparatus, manufactured by using the manufacturing method according to claim 23, wherein the protruding Portions are formed by a droplet discharge method.

26. A panel for an electro-optical apparatus, manufactured by using the manufacturing method according to claim 23, wherein the conductive layers or the wires are formed by a droplet discharge method.

* * * * *